United States Patent [19]

Cusano

[11] Patent Number: 4,898,648
[45] Date of Patent: Feb. 6, 1990

[54] METHOD FOR PROVIDING A STRENGTHENED CONDUCTIVE CIRCUIT PATTERN

[75] Inventor: Dominic A. Cusano, Schenectady, N.Y.

[73] Assignee: Pacific Bell, San Francisco, Calif.

[21] Appl. No.: 271,898

[22] Filed: Nov. 15, 1988

[51] Int. Cl.$^4$ .......................... C25D 5/02; B05D 3/06; B05D 3/10; B05D 5/12
[52] U.S. Cl. ..................................... 204/15; 427/53.1; 427/98; 427/264; 427/265; 427/306
[58] Field of Search ................ 427/53.1, 98, 306, 264, 427/265; 204/15

[56] References Cited

U.S. PATENT DOCUMENTS

| | | | |
|---|---|---|---|
| 4,659,587 | 4/1987 | Imura et al. | 427/35 |
| 4,661,213 | 4/1987 | Dorsett et al. | 204/15 |
| 4,681,774 | 7/1987 | Halliwell et al. | 427/53.1 |

Primary Examiner—Evan Lawrence
Attorney, Agent, or Firm—McCubbrey, Bartels, Meyer & Ward

[57] ABSTRACT

A method for providing a circuit pattern on an insulated substrate that has improved adherence thereto. By providing an electroless conductive layer of a predetermined thickness on the substrate and thereafter exposing the substrate to an ablative laser beam, the resultant conductive lines are stronger than those provided by previously known techniques.

5 Claims, 3 Drawing Sheets

METHOD FOR PROVIDING A STRENGTHENED CONDUCTIVE CIRCUIT PATTERN

FIELD OF THE INVENTION

The present invention relates to the electroless plating of metals and, more specifically, to techniques in which the pattern of the plated metal is determined by laser processing.

BACKGROUND OF THE INVENTION

There are a number of applications in which conductive materials must be selectively applied to the surface of an insulating substrate. One example is printed circuit boards that have conductive lines plated thereon. These conductive lines may be fabricated by bonding a metallic strip to the substrate; however, it is preferred that the lines be plated directly on the insulating material.

There are a number of known techniques for the electroless plating of metal on insulating substrates. The processes are referred to as electroless because they do not require that an electrical current be passed through the object being plated.

Among these prior art techniques are methods utilizing ultraviolet light to selectively pattern metal onto an insulating substrate. Typically, the spatial distribution of the plated metal on the surface of the substrate is determined by exposing the surface to ultraviolet light after coating the surface with a catalyst, referred to as a photo-promoter. The plating methods are often grouped into "positive" and "negative" methods. Positive methods are those in which metal will be plated in those regions exposed to the ultraviolet light. Negative methods are those methods in which metal will be deposited in those regions which are not exposed to the ultraviolet light.

De Angeleo, et al. (U.S. Pat. No. 3,562,005) describe a method for selectively patterning metal onto an insulating substrate. In the method described by De Angeleo, et al., a photo-promoter such as stannous chloride is used as a photosensitive catalyst. In this procedure, a stannous chloride solution is applied to the surface of the material to be plated. The portions of the surface which are not to be plated are then exposed to ultraviolet light having a wavelength less than 300 nm. Following the exposure to the ultraviolet light, the surface is exposed to a salt of a precious metal such as palladium chloride. In those areas which were not exposed to the ultraviolet light, the following reaction takes place:

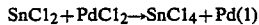

$$SnCl_2 + PdCl_2 \rightarrow SnCl_4 + Pd \quad (1)$$

The areas which were exposed to the ultraviolet light show no palladium formation, since the absorbed stannous chloride is photochemically oxidized to stannic chloride. Stannic ions cannot reduce the palladium ions in the palladium chloride to metallic palladium. Once the metallic palladium layer is formed, other metals may be electrically plated onto the locations covered by the palladium using conventional plating techniques. De Angeleo, et al. describe processes based on the precious metals palladium, platinum, gold, silver, osmium, indium, iridium, rhenium and rhodium.

Although these processes work effectively for many purposes, they do have some deficiencies. For example, it is very important in these processes that the catalyst be carefully patterned onto the substrate surface. Sometimes the catalyst is inadvertently applied in an area that should not contain metal. In addition, the conductive lines produced utilizing these processes oftentimes do not have the strength is necessary for use in a printed circuit board.

One alternative process uses a laser beam for forming the conductive circuit pattern. In this process, a metal layer is applied covering the entire substrate surface. This layer is then patterned by selectively removing the metallization in predefined areas. The metal is removed using a laser.

The metal layer may be applied to the substrate using any of a number of processes. For example, the substrate may be coated with $SnCl_2$ and then immersed in a $PdCl_2$ bath. This results in a layer of metallic Pd being deposited on the surface of the substrate. After the precious metal layer is applied to the substrate, the layer is patterned by utilizing a laser beam to remove the metal layer. Thereafter, conductive metal lines are plated on the patterned metal layer in accordance with known techniques.

Typically, $CO_2$ or YAG lasers are utilized to thermally vaporize the metal layer in the areas of the substrate that are to be devoid of metal. These laser processes, although effective for many purposes, are oftentimes not as precise or reliable as needed when patterning conductive lines for a printed circuit board. The above-mentioned types of laser processes rely on heat for cutting through the material to be processed. Hence, the processes depend on relatively long wavelength light which can be difficult to control in providing minimum depth cuts in a material.

More particularly, in providing conductive lines on the substrate surface, as before mentioned, the plated metal (such as palladium) on the substrate is very thin, on the order of 10 to 40 angstroms. Thus, it is very important that the laser penetrate the metal layer a very short distance to avoid degradation of the substrate. The above-mentioned processes are difficult to control to these depths. In addition, these processes leave a large percentage of their energy in the substrate due to thermal activity. In so doing, the area surrounding the processed portion of the substrate is damaged by the thermal effects. Hence, the above-mentioned laser processes are not as effective as desired when a small area is to be patterned.

Excimer lasers are finding increasing use as an alternative to the above-mentioned laser processes for the selective patterning of a metal layer that is on the surface of an insulating substrate. Excimer lasers are those lasers producing relatively short wavelength light, such as in the ultraviolet range. Excimer lasers typically operate at a wavelength of 180 to 370 nm at 50 to 200 millijoules of power. Of particular importance to this process is that excimer lasers remove material by ablation rather than by melting or vaporization.

In many cases, this ablative mechanism results in a higher degree of precision than can be achieved through other types of laser processes. What is meant by the ablative mechanism in this application is that when an ultraviolet light of sufficient energy irradiates a surface, the energy interacts with the material of the surface and results in the decomposition and ejection of the surface layer.

Although a detailed understanding of the complex ablative mechanisms has yet to be developed, all recent theories agree on the following two points. (1) The ablative material is removed layer by layer on a pulseby-pulse basis of the excimer laser; and (2) the majority of the energy in the laser pulse is used in bond breaking and ejecting ablative material from the substrate. Consequently, very little energy remains in the substrate, and the thermal diffusion to surrounding areas is greatly reduced.

The physical mechanism of ablation differs remarkably from the thermal mechanisms of other laser processes for material removal. Hence, excimer lasers offer new capabilities in the area of electroless plating.

The ablative mechanism gives rise to several characteristics which are unique to excimer laser operation. First, the materials can be removed with extremely high precision and excellent edge definition. Second, there is significantly less charring or burning of the surrounding material. Third, there is a minimum heat effective zone, that is, there would be little if any distortion of the substrate using the laser. Finally, the definition of patterns by mask imaging can be done rather than by translation of a focused spot of laser light along a trajectory on the substrate surface, as used in non-ablative laser processing. Thus, an entire area on the substrate can be processed at once.

Another key feature of the excimer laser processing technique is that the absorption of the energy occurs within a localized region near the surface of the irradiated material. Therefore, there is little opportunity for thermal diffusion to the surrounding material. Consequently, the exposed material can be removed while the underlying material is left virtually untouched, even in the case of very thin layers of metal.

Although in principle this can also be achieved using $CO_2$ or other type lasers, in practice, the thermal nature of conventional laser processing will ultimately do considerable destruction to the remaining substrate. Hence, the use of excimer lasers for patterning a substrate which has a thin metal layer plated thereon provides clear advantages over other types of laser processing techniques.

However, a particular problem with all of the above laser processing techniques is that the overall adherence of the resultant conductive layer to the substrate is oftentimes unacceptably low. Hence, the quality and integrity of the circuit pattern is also compromised.

More particularly, it has been found that when a circuit pattern is provided utilizing known ablative laser processing techniques, oftentimes the circuit pattern can be easily peeled away from the surface of the substrate. Hence, the printed substrates have to be carefully handled to ensure the integrity of the circuit pattern. In addition, when electrical connections are made to the circuit pattern, there is the danger that the connections are defective or faulty due to the adherence problem.

Since there may be thousands of these circuit patterns utilized in conjunction with certain applications, it is important to provide a reliable and effective method and apparatus for providing a conductive circuit pattern that has a higher adherence to the substrate than previous systems obtained when utilizing the ablative laser process.

Broadly, it is an object of the present invention to provide an improved system and method for conductive circuit patterning utilizing laser ablation.

It is also an object of the present invention to provide a system and method that produces strengthened conductive lines compared to those lines produced by previously known laser techniques.

These and other objects of the present invention will become apparent to those skilled in art from the accompanying detailed description.

SUMMARY OF THE INVENTION

The present invention comprises a system and method for providing an improved circuit pattern affixed to the surface of an insulating substrate. The system comprises providing a catalytic layer on the substrate surface, plating a first metallic layer of a predetermined thickness on the catalytic layer, and exposing predetermined regions of said first metallic layer to an ablative laser beam so as to remove the first metallic layer in the predetermined regions.

By providing a metallic layer of copper or the like on the substrate surface prior to the ablative laser process, the adherence of the resultant conductive pattern is significantly increased. Accordingly, the present invention provides a method and apparatus for strengthening the adherence of the conductive circuit pattern to a substrate.

BRIEF DESCRIPTION OF THE DRAWINGS

The advantages of the present invention will become more apparent from the following detailed description and the drawings in which.

DETAILED DESCRIPTION

Figure 1:
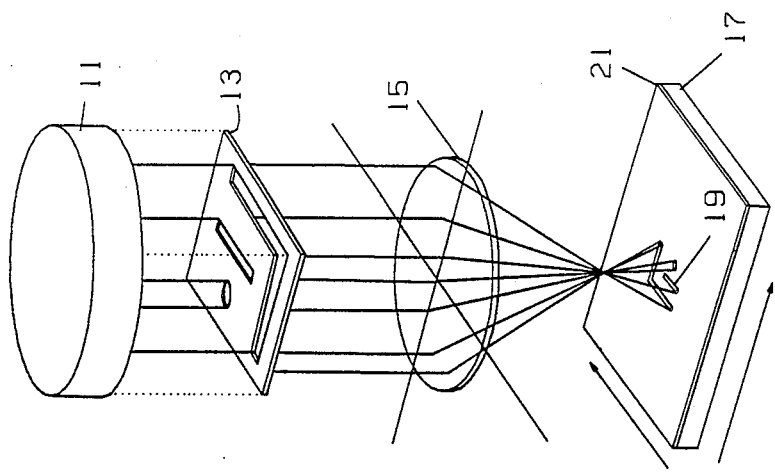
FIG. 1 is a pictorial perspective view of the laser ablation process of the prior art.

The present invention will be better understood by first referring to a typical prior art laser ablation process shown in FIG. 1. FIG. 1 depicts a typical optical arrangement utilized in an excimer laser ablation process. The optical arrangement comprises an excimer laser 11, a mask 13, a lens 15 and a substrate 17. The substrate 17 is typically comprised of a plastic, such as Ultem TM polytherimide. Alternatively, the substrate can be of a glass composition. As has been before mentioned, the substrate 17 has a very thin layer (10–40 angstroms) of precious metal 21, such as palladium, affixed thereto by dipping the substrate 17 in a bath of the precious metal 21 after coating substrate 17 with a promoter such as stannous chloride.

A mask 13 provides a mask pattern 19 on the substrate 17 which defines the circuit pattern. The mask 13 is typically a metal which is substantially impervious to the laser light. The mask pattern 19 is relayed onto the substrate 17 by the lens 15. When the laser beam 10 from the excimer laser 11 is activated, the mask pattern 19 is reproduced on the substrate 17.

When the laser hits the thin metal layer 21 on the substrate 17, the radiation penetrates to the metal/substrate interface and produces a pressure build-up at the interface. The pressure build-up is the result of the decomposition of the substrate 17, in the case of polymeric materials, or of degassing, in the case of glass. The crucial parameter controlling the effectiveness of metal removal is the ability of this pressure build-up to explosively remove the metal.

As before mentioned, this explosive force ejects both the thin metal layer 21 and a thin layer of the substrate 17 from the metal/substrate interface. Thereafter, a metal layer such as copper is plated onto the thin metal layer 21 to provide a conductive circuit pattern.

Although this system works effectively in many applications, it has been found that oftentimes the resultant conductive circuit pattern (i.e., the electroless and electroplating of the conductive layers) does not sufficiently adhere to the surface of the substrate 17. It has been found that the pull strength of the resultant electroplated copper line can be as low as 3 lbs./in.$^2$ when copper is utilized as the conductive metal.

This is an unacceptably low pull strength when the printed circuit pattern is utilized for certain applications. This low pull strength represents a particular problem in the manufacturing environment since the adherence problem will be replicated over many boards. In addition, it has been found at this pull strength the resultant conductive lines can be easily pulled off of the substrate, hence creating a serious quality control problem when printed circuit boards are fabricated utilizing the above-mentioned system.

Accordingly, what is needed is a method and system for providing a circuit pattern that adheres more effectively to a substrate than the circuit pattern produced by previously known techniques.

Figure 2:
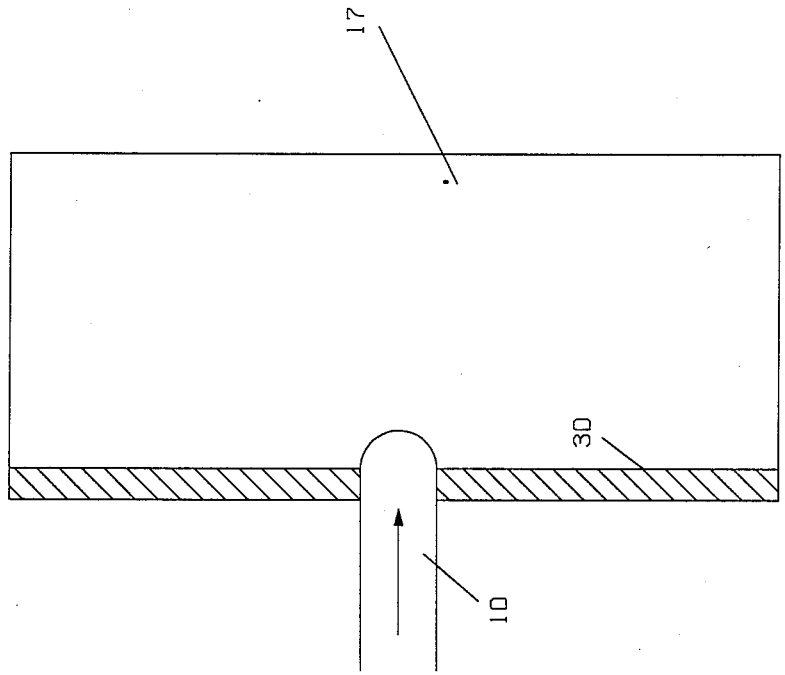
FIG. 2 is a cross-sectional side view of a substrate patterned in accordance with the present invention.

Referring now to FIG. 2, in an embodiment of the present invention, it has been found that a stronger electroplated copper conductive pattern can be provided to the substrate 17 where the laser beam ablates a thin, approximately 150 to 350 nm, electroless copper layer 30. The copper layer is provided by first plating a catalytic layer such as palladium onto substrate 17 and then plating copper onto the catalytic layer. In contrast, in the process illustrated in FIG. 1, the catalytic layer is applied to the substrate and that layer is patterned with the ablative laser beam. Thereafter, a copper layer is plated on the patterned catalytic layer lines. The advantage of the present invention is that rather than bonding to the very fragile, very thin catalyst itself, the electroplated conductive lines can be bonded directly to the electroless conductive layer 30. It has been discovered that the pull strength of the conductive lines provided thereby is greater than that provided by the prior art excimer laser systems.

For purposes of clarity, it should be noted that the thicknesses of the various layers on the substrate 17 have been exaggerated for illustrative purposes to add clarity to the following explanation.

In this embodiment, the substrate 17 includes an electroless conductive layer 30. The laser beam 10, upon hitting the interface of the substrate 17 and the electroless copper layer 30, provides the conductive circuit pattern. It has been found that the pull strength of the resultant electroplated conductive line can be as high as 9 lbs./in.$^2$, when copper is utilized as the conductive metal.

Figure 3:
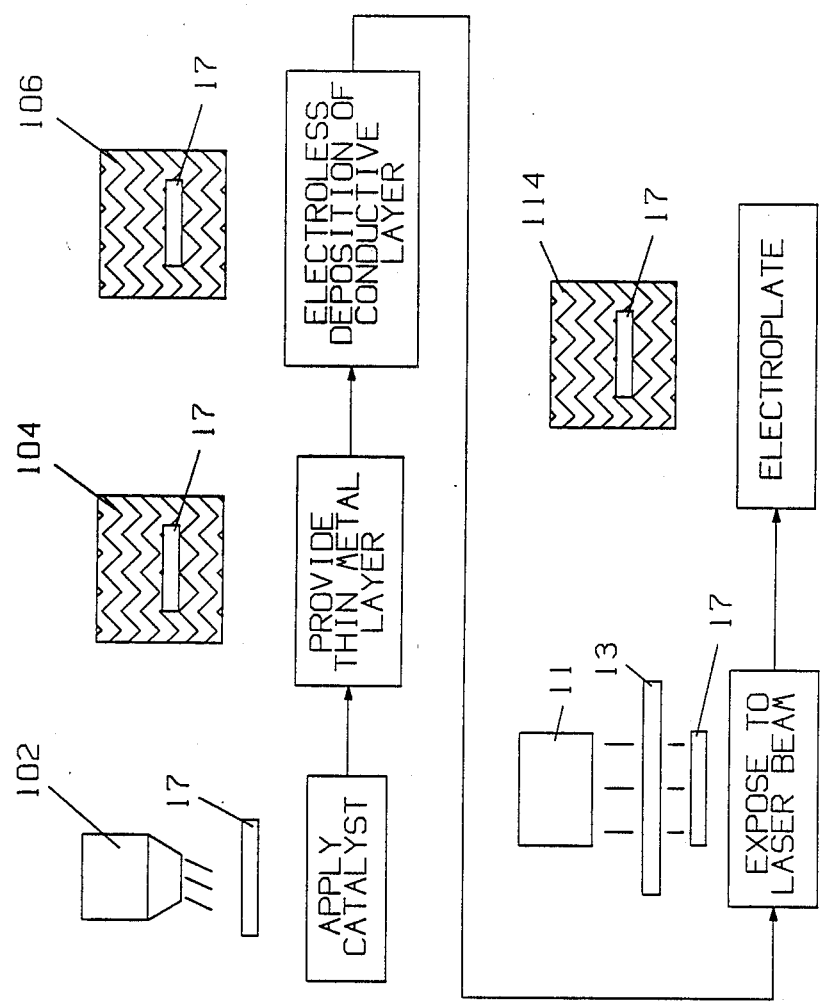
FIG. 3 is a block diagram of the system for patterning the substrate in accordance with one embodiment of the present invention.

To more clearly describe the method and apparatus utilized in conjunction with the embodiment of FIG. 2, refer now to FIG. 3, which shows a block diagram of the process with associated apparatus for providing a circuit pattern in accordance with the present invention.

The process starts with a substrate having a metallic layer bonded to the surface thereof. This metallic layer may be applied as follows: a promoter, e.g., SnCl$_2$, is applied to the surface of the substrate 17, for example by sprayer 102; Thereafter, a precious metal is deposited on the promoter covered regions of the surfaces. For example, Pd may be deposited by applying PdCl$_2$ to the promoter covered surface in bath 104. Thereafter, the substrate 17 is electrolessly plated with a conductive layer, for example by bath 106. The resultant thickness of this layer, as before mentioned, is between 150 and 350 nanometers.

The regions of the substrate which are to retain the conductive layer are then optically masked by mask 13. Thereafter, the excimer laser 11 ablates away the conductive layer on the substrate 17 to produce a predetermined circuit pattern. Another conductive layer, such as copper, can then be electroplated on the patterned surface (bath 114).

Hence, through this system, as has been before described, a strong conductive circuit pattern is produced.

In the above-mentioned system, the electroless conductive layer as well as the electroplated conductive lines are preferably copper. However, one of ordinary skill in the art recognizes that these conductive layers could be a variety of conductive metals, and their use would be within the spirit and scope of the present invention. Gold, silver, osmium, platinum, indium, iridium, rhenium and rhodium may also be utilized for the catalytic layer. Aluminum, gold, silver, chromium and titanium may also be utilized for the conductive layer plated thereon.

As has been before mentioned, in previous circuit patterning methods utilizing excimer lasers, oftentimes the resultant conductive pattern did not have sufficient adherence to the surface of the substrate. This system, in accordance with the present invention, provides an electroless conductive metal layer on the substrate surface which significantly improves the pull strength. In so doing, a higher quality and strength circuit pattern than those produced by previous techniques is provided.

Accordingly, the present invention provides for an improved system and method for providing a pattern for conductive lines on a printed circuit board.

Although the present invention has been described in accordance with a specific illustrative embodiment, one of ordinary skill in the art will recognize that a variety of modifications can be made to that embodiment and the modifications would be within the spirit and scope of the present invention. The scope of the present invention is defined, therefore, only by the scope of the appended claims.

What is claimed is:

1. A method for providing a patterned metallic layer on a surface of an insulating substrate comprising the steps of:
    (a) providing a catalytic layer on said surface of said substrate for facilitating the deposition of metallic layers on said substrate;
    (b) plating a first metallic layer of a predetermined thickness on said catalytic layer; and
    (c) exposing first predetermined regions of said first metallic layer to an ablative laser beam so as to remove said first metallic layer in said first predetermined regions and to retain said first metallic layer in second predetermined regions.

2. The method of claim 1 which comprises the further step of:
    plating a second metallic layer on said second predetermined regions still having said first metallic layer thereon.

3. The method of claim 2 wherein said first metallic layer is a metal chosen from the group consisting of copper, aluminum, gold, silver, chromium, and titanium.

4. The method of claim 3 wherein said catalytic layer is a metal chosen from the group consisting of gold, silver, osmium, palladium, platinum, indium, iridium, rhenium and rhodium.

5. The method of claim 4 in which said predetermined thickness of said first metallic layer is between 150 nanometers and 350 nanometers.

* * * * *

UNITED STATES PATENT AND TRADEMARK OFFICE
CERTIFICATE OF CORRECTION

PATENT NO. : 4,898,648

DATED : February 6, 1990

INVENTOR(S) : Dominic A. Cusano

It is certified that error appears in the above-identified patent and that said Letters Patent is hereby corrected as shown below:

Column 5, line 66, delete ";" and insert --.--.

Column 1, line 63, after "rhenium" insert --,--.

Column 2, line 3, after "strength" insert --that--.

Column 4, line 41, after "lens 15" insert --,--.

Column 5, line 16, after "found" insert --that--.

Column 6, line 3, after "example" insert --,--.

Signed and Sealed this

Twenty-ninth Day of October, 1991

Attest:

*Attesting Officer*

HARRY F. MANBECK, JR.

*Commissioner of Patents and Trademarks*